United States Patent [19]

Itoh et al.

[11] Patent Number: 4,541,015

[45] Date of Patent: Sep. 10, 1985

[54] TWO-DIMENSIONAL IMAGE READOUT DEVICE

[75] Inventors: Masataka Itoh, Tenri; Shohichi Katoh, Yamatokoriyama, both of Japan

[73] Assignee: Sharp Kabushiki Kaisha, Osaka, Japan

[21] Appl. No.: 580,386

[22] Filed: Feb. 15, 1984

[30] Foreign Application Priority Data

Feb. 15, 1983 [JP] Japan ................................. 58-24307
Mar. 3, 1983 [JP] Japan ................................. 58-35608

[51] Int. Cl.³ .......................................... H01M 3/14
[52] U.S. Cl. .................................... 358/212; 250/578; 358/209
[58] Field of Search ................. 358/209, 212, 213; 250/578

[56] References Cited

U.S. PATENT DOCUMENTS

| | | | |
|---|---|---|---|
| 4,010,376 | 3/1977 | Duck | 250/578 |
| 4,271,435 | 7/1981 | Takenouchi et al. | 358/213 |
| 4,288,702 | 9/1981 | Ozawa et al. | 250/578 |
| 4,348,611 | 9/1982 | Ruppel et al. | 313/388 |
| 4,419,696 | 12/1983 | Hamano et al. | 358/294 |
| 4,431,913 | 2/1984 | Sekimoto et al. | 250/211 R |
| 4,471,270 | 9/1984 | Guyot | 315/374 |

Primary Examiner—Gene Z. Rubinson
Assistant Examiner—Robert Lev
Attorney, Agent, or Firm—Birch, Stewart, Kolasch & Birch

[57] ABSTRACT

The present disclosure is directed to a two-dimensional image readout device. The device includes a sensor device consisted of an insulating substrate, a plurality of parallel Y electrodes of conductor, a plurality of X electrodes disposed in a direction normal to the Y electrodes with a spacing therebetween and a photoconductive layer interposed in the spacing between the Y and X electrodes, at least one of the Y and X electrodes being made of transparent material. There are further provided an optical system for leading to a surface of the sensor device an image to be read out, a control circuit for scanning the photoconductive layer in association with guide operation for leading the image to the surface of the sensor device via the optical system while the electrodes are switched.

9 Claims, 8 Drawing Figures

TWO-DIMENSIONAL IMAGE READOUT DEVICE

BACKGROUND OF THE INVENTION

This invention relates to an image readout device, and more particularly it relates to a two-dimensional image readout device in which sensor elements are disposed in a two-dimensional manner.

In the past years, MOS image sensors, CCD sensors, and contact type image sensors were proposed as devices to read out an image for use in telecopier or facsimile machines. The MOS type image sensor is a device by which incident images are scanned with an MOSIC and converted into electric signals through opto-electric transducers. The CCD sensor is a device in which light-induced charges at opto-electric converting areas are transferred through charge-coupled elements (CCD).

It is, however, inconvenient from functional and economical points of view to make an MOS type or CCD type sensor of a large area since those sensors rely upon the IC technique for buildup thereof on a monocrystalline substrate. Generally, an optical lens is used for scaling-down and focusing of an image of the original onto the sensor. This method has the disadvantages that an optical path becomes longer and it is difficult to reduce the machine to a compact size because of the use of the optical lens.

To improve the above scaling-down/focusing type of image sensor, the contact type image sensor has been proposed which uses a sensor of the same size as the original and optical fiber for focusing an image of the same size as the original. For the contact type image sensor, an opto-electric converting area of the same dimensions as the original is necessary which requires deposit of a uniform layer over a large area. As an example of the contact type of image sensor, a one-dimensional contact type has been suggested which has a CdS photoconductive layer divided into individual islands. This device however, is complicated in structure because the photoconductive layer is divided during manufacture and individual electrodes need to be provided for the respective islands of the photoconductive layer. Another outstanding problem with this device is that readout speed is limited mainly due to light response speed of the photoconductive layer. Especially, the CdS photoconductive layer is poor in light response speed and applicability of this device as a one-dimensional image sensor is therefore substantially restricted.

Furthermore, another contact type of sensor has been proposed which has a strip-shaped photoconductor using amorphous silicon. If a two-dimensional image is to be read out with this type of one-dimensional sensor, then the sensor shall be repeatedly used and the same portion of the sensor shall be supplied with a voltage in a cyclic manner for readout of signals. For this reason, current variations responsive to brightness variations between "light" and "dark", that is, rising and falling characteristics directly affect readout signals and impose limits on readout speed. Those outstanding problems shall be solved by putting two-dimensional image sensors into practical use.

OBJECT AND SUMMARY OF THE INVENTION

Accordingly, it is an object of the present invention to provide a novel structure of a two-dimensional image readout device which overcomes the foregoing problems and is effective not only to conventional contact type image sensors but to two-dimensional image sensors.

It is another object of the present invention to provide a two-dimensional image readout device in which optical and electric scanning is carried out on working surfaces of the sensor with a minimum of electrode leadout terminals.

To achieve the above objects, the present invention provides a two-dimensional image readout device which comprises a sensor device including an insulating substrate, a plurality of parallel Y electrodes of conductor, a plurality of X electrodes disposed in a direction normal to said Y electrodes with a spacing therebetween and a photoconductive layer interposed in said spacing between said Y and X electrodes, at least one of said Y and X electrodes being made of transparent material; an optical system for leading to a surface of said sensor device an image to be read out; a control circuit for scanning said photoconductive layer in association with guide operation for leading said image to the surface of said sensor device via said optical system while said electrodes are switched; and a power supply circuit for voltage supply to a selected portion of the photoconductive layer.

As stated briefly, the present invention provides a readout device in which sensor elements are disposed in a two-dimensional manner and the X and Y electrodes on the sensor surface are scanned. Even if the photoconductive layer manifests poor light response, sensor operation is not adversely affected and higher readout speed can be ensured compared to conventional one-dimensional sensors. Furthermore, since a read-size image is projected onto the sensor device for readout, it allows greatest flexibility for design of the electrode structure. This flexibility, combined with simplicity of the structure of the sensor device, makes it very easy to manufacture the sensor device. Thus, inexpensive two-dimensional image readout devices are provided.

DETAILED DESCRIPTION OF THE INVENTION

Figure 1:
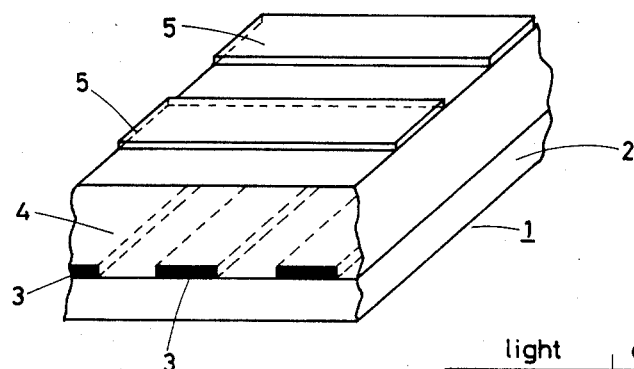
FIG. 1(a) is a perspective view of a sensor device according to an embodiment of the present invention.
FIG. 1(b) is a cross sectional view of the sensor device.
Figure 1:
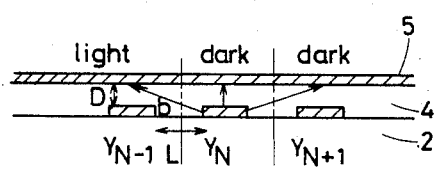

Referring to FIG. 1, there is illustrated a perspective view of a sensor 1 of an image readout device according to an embodiment of the present invention. The sensor 1 comprises a substrate 2 of insulating material such as glass having the substantially same area as that of a two-dimensional image to be read out, and Y electrodes 3 equally spaced in parallel by deposit of Al or the like on a surface of the substrate 2. While the width and pitch of the respective Y electrodes 3 has influence on resolution of the sensor 1, it is desirable that those dimensions be as small as possible within a range permissible under under light output characteristics of a photoconductive layer of a predetermined thickness.

There is disposed a photoconductive layer 4 over the substrate 2 having the Y electrodes 3 thereon. The photoconductive layer 4 contains a mixture mainly of photoconductive CdS particles dispersed in resin material, overlying the whole area of a two-dimensional plane on the substrate 2 with a uniform thickness. Further disposed on the photoconductive layer 4 are X electrodes 5 in a direction normal to the Y electrodes 3 in the substantially same pitch as the Y electrodes 3. To permit readout of the image, the X electrodes 5 are made up of transparent insulating material. In case where the substrate 2 is made of such transparent insulating material and the Y electrodes 3 are aslo made of transparent electrode material, the substrate side 3 may be used as an image input side and the X electrodes 5 may be made of Al or the like. It is noted that the distance D between the X and Y electrodes sandwiching the photoconductive material 4 and the spacing between the Y electrodes 3 are correlated as L>D. In a representative example of the sensor device, $L=50$ μm and $D=20$ μm.

The image is projected onto the sensor device of the above described electrode structure. A cross sectional view of the structure including the X electrode 5 and the Y electrode $Y_{N-1}$, $Y_N$ and $Y_{N+1}$ is illustrated in FIG. 1(b), wherein "dark" image is applied to only the Nth electrode $Y_N$. Should the distances L, D be correlated as L<D as described above, current flowing along a slanting path b will become large. As a result, a substantial amount of current will flow through the Y electrode subject to the "dark" image due to its neighboring "light" circumstance, remarkably impairing the accuracy of image readout at the intersections of the X and Y electrodes. Nevertheless, in the case where L>D as in the above illustrated embodiment, current flowing along the slanting direction b is negligible because of the smaller distance D. In this case, image information on the electrodes can be converted into electric signals with a higher degree of accuracy.

Figure 2:
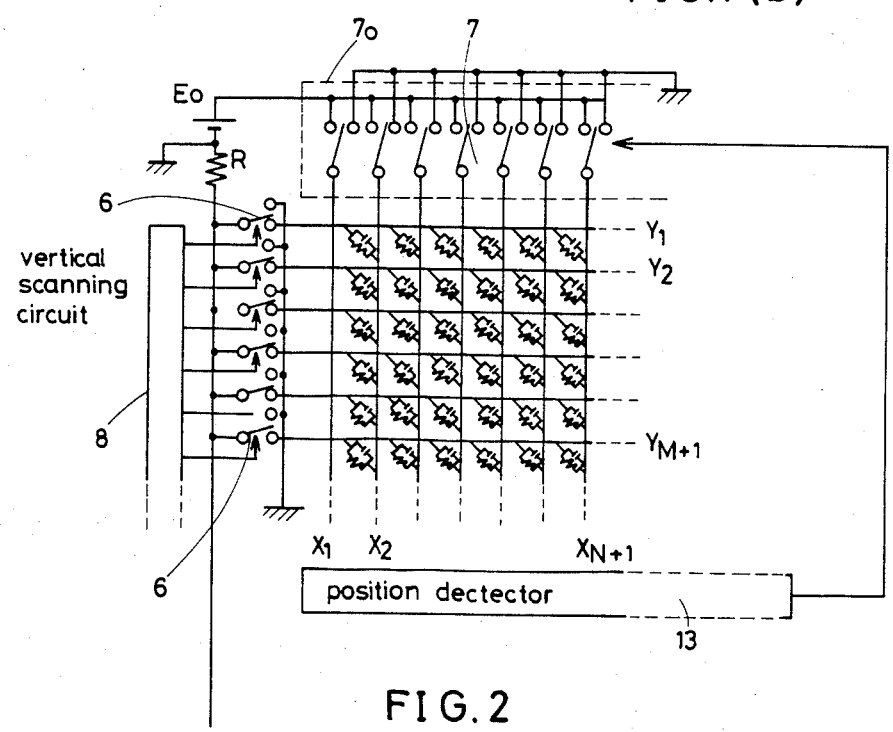
FIG. 2 is a circuit diagram of the sensor device according to the above illustrated embodiment of the present invention.

The sensor device 1 having the Y electrodes 3 and the X electrodes 5 sandwiching the two-dimensional continuous photoconductive material 4 is equivalent to a device in which sensor elements each having a separate photoconductive layer between a pair of opposing electrodes or a Y electrode 3 and an X electrode 5 are arranged in a matrix. Each of the elements can be represented in a parallel circuit of a capacitor C and a resistor R as shown in an equivalent circuit diagram of FIG. 2 and a plurality of such parallel circuits are arranged in a matrix. The X and Y electrodes of the sensor device 1 are connected to a power supply via switching elements 6, 7 for scanning those electrodes for image readout. The switching element 6 connected to the Y electrode 3 is switched on and off by a control signal from a vertical scanning circuit 8.

Figure 3:
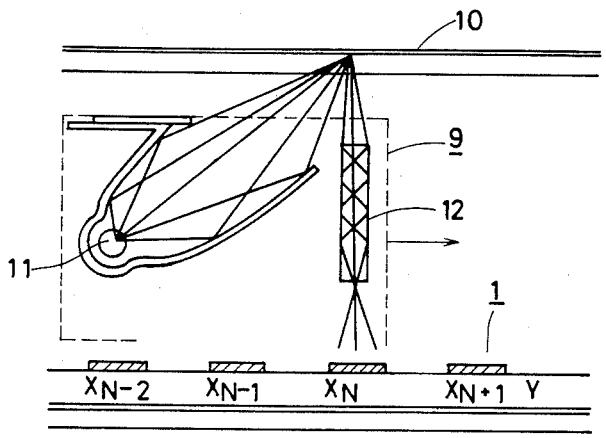
FIG. 3 is a schematic view showing coupling with an optical system in the embodiment.
Figure 5:
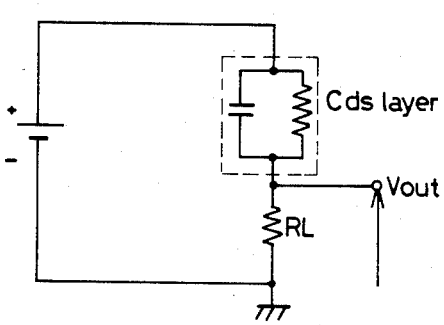
FIGS. 5(a) and 5(b) are equivalent circuit diagrams of a sensor element in the present invention.
Figure 5:
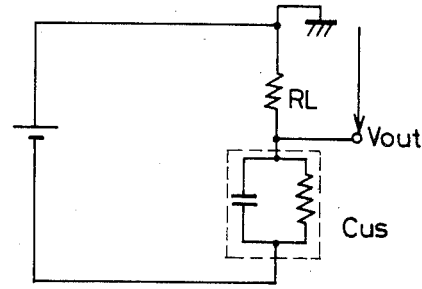

To lead the image onto the image surface, the sensor device 1 is provided with an optical system 9 as shown in FIG. 3, for example. The optical system 9 comprises a light source 11 having a reflective surface for illuminating an original 10 with focused light beams and a fiber optic lens 12 for leading reflective light from the original 10 to the line-shaped X electrodes 5 of the transparent material. Should the fiber optic lens 12 be located just above the Nth X electrode $X_N$, nothing but the Nth electrode $X_N$ is connected to the power supply through switching on of the switching element $7_N$. The switching elements 7 leading to the X electrodes 5 are switched on and off in the following manner. A position detector 13 shown in FIG. 2 sees the positional relationship between the fiber optic lens 12 and the sensor device 1 and an optical signal from the position detector 13 is supplied to a switching control $7_0$ including the switching elements 7, so that a particular switching element $7_i$ associated with the $X_i$ electrode situated beneath the fiber optic lens 12 is turned to the power supply. As seen in equivalent circuits of FIGS. 5(a) and 5(b), a voltage negative or positive with respect to the ground is supplied and an output signal is delivered through a load resistor $R_L$ between the photoconductive material and the ground. Under these circumstances, the X and Y electrodes supplied with no voltage are led to the ground via the vertical switching elements 6 and the horizontal switching elements 7.

To read out the two-dimensional image of the original 10, the optical system 9 moves with respect to the original 10 and the sensor device 1. In the illustrated embodiment, the optical system 9 moves at a speed V in a direction from the $X_1$ electrode toward the $X_{N+1}$ electrode. While the optical system 9 is traveling at speed V, the Y electrodes are automatically scanned at scanning speed of more than M+1 (M+1: the number of the Y electrodes). Eventually, the image projected onto the electrode portions facing against the fiber optic lens 12 is converted into electric signals and then delivered from between the electrodes as readout signals from the photoconductive elements. Subsequent to and in synchronism with movement of the optical system 9 an image signal on the neighboring X electrode is read out. The two-dimensional original incident upon the whole of the sensor device 1 can be read out by sequentially switching the X electrodes 5. Two-dimensional scanning is made possible by moving the original 10 and the sensor device 1 in the same direction and speed instead of moving the optical system 9.

It is well known that the photoconductive material 4 becomes conductive upon light radiation but shows a very high resistance against the surrounding "dark" portion. In no event shall readout operation of the sensor device 1 be impaired in the illustrated embodiment wherein the photoconductive layer is not divided but continuous over the whole of the two-dimensional plane. Furthermore, it is possible to prevent crosstalk current due to matrix wiring if the terminals other than those operative for voltage supply are connected to the ground.

For example, with an A4 size original readout device having a two-dimensional image sensor device of the above described structure with a density of 8 lines/mm and an area of 320 (X direction)×230 (Y direction) mm² and 2560 X electrodes and 1840 Y electrodes, satisfactory image readout was achieved with good S/N ratio when the optical system was traveling at a speed $V=250$ mm/sec and the switching frequency of the Y electrodes was 4 MHz. In other words, an A4 original was scanned within about 1 sec (0.5 msec/line). When the terminals other than those operative for voltage supply were grounded, leak current could be reduced to a thousandth of that when they were not grounded, entailing S/N ratio enhancement. In the case of a one-dimensional sensor using the same photoconductive material, a readout time of more than 50 msec/line was necessary in order to ensure the same S/N ratio as with the above detailed sensor device and image readout operation was very slow. However, in the case of the above illustrated embodiment, wherein the sensor portion was designed in two-dimensional manner and the image readout position of the sensor device was moved sequentially or scanned, high speed readout could be achieved without being affected by the light response characteristics of the photoconductive layer.

Figure 4:
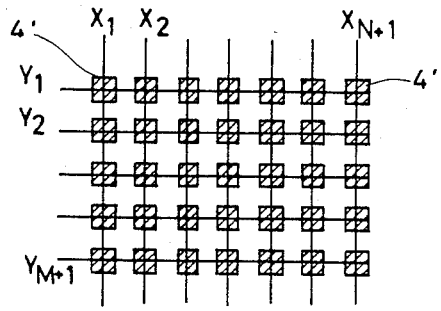
FIG. 4 is a schematic view of a sensor device according to another embodiment of the present invention.

In FIG. 4, there is illustrated a schematic view of a sensor device according to another embodiment of the present invention. Like the above embodiment, this alternative embodiment is adapted such that there are disposed Y and X electrodes running in a normal direction to each other over the insulating substrate 1 with intervention of photoconductive layers 4'. The difference lies in that the photoconductive layers 4' are not continuous over the whole of the two-dimensional plane but independent and separate for each intersection of the matrix.

If the Y electrodes 3 are scanned and the X electrodes are sequentially switched in this embodiment, the device can deliver image readout signals as a two-dimensional image sensor. Because the photoconductive layers in respective elements are separate in the second embodiment, there is no flow of current snaking into the adjacent electrodes via the photoconductive layers so that the sensor device is free from the distance limitation $L > D$ as discussed with respect to the first embodiment. Similarly, if the electrodes with no voltage supplied are all grounded, then crosstalk current can be completely eliminated.

Figure 6:
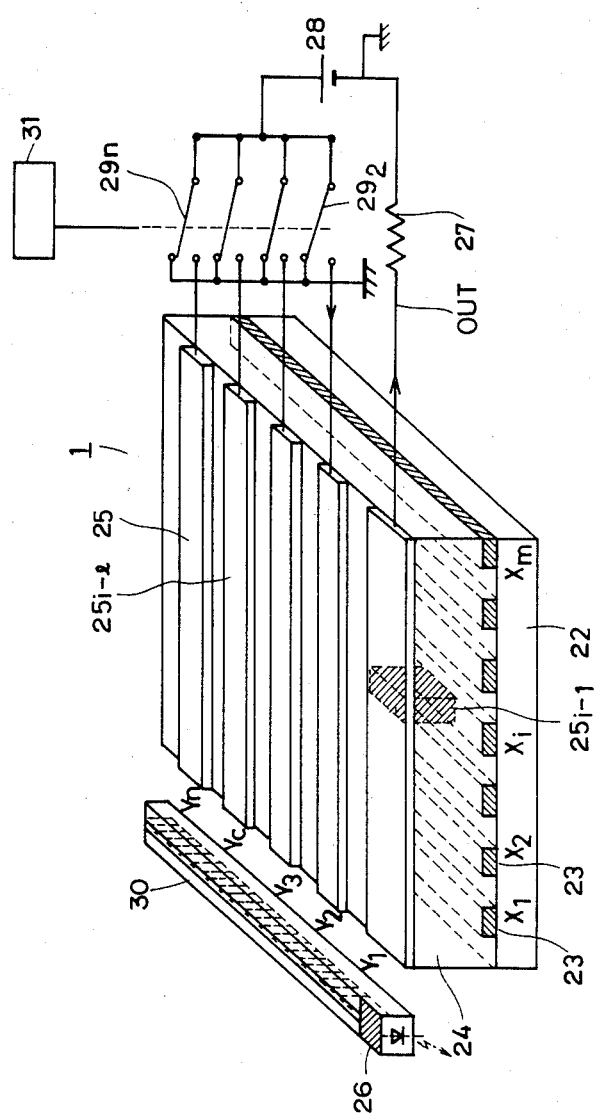
FIG. 6 is a perspective view of a sensor device according to still another embodiment.

In FIG. 6, there is illustrated still another embodiment of the present invention in which the sensor device similarly includes a substrate 22, stripe-shaped X electrodes 23, a photoconductive layer 24 and Y electrodes 25 of transparent material. On the transparent Y electrode side 25, at least one of the n Y electrodes, for example, the first electrode $Y_1$ is used as an electrode for selection of a particular X electrode $X_i$ from the group of the X electrodes during image readout, while the remaining electrodes $Y_2$ to $Y_n$ are electrodes for makeup of an image sensor matrix. A switching light source 26 (e.g. LED) lightens a region corresponding to the width of a single X electrode disposed against the electrode $Y_1$ for selection of the X electrodes. The electrode $Y_1$ itself is connected to one end of a power supply 28 via a resistor 27. The remaining electrodes $Y_2$ to $Y_n$ are connected commonly to the other end of the power supply 28 via switching elements $29_2$ to $29_n$. An optical fiber array 30 is secured against the electrodes $Y_2$ to $Y_n$ to lead image information to the electrodes $Y_2$ to $Y_n$.

It is noted that the optical fiber array 30 is disposed in a straight line against the switching light source 26. The switching elements $29_2$ to $29_n$ are sequentially selected with signals from a scanning circuit 31, and all of the elements are scanned once while the optical fiber array 30 is faced against the particular X electrode. At this time terminals not connected to the power supply, out of terminals for the Y electrodes, are grounded through the switching elements. Terminal OUT is to deliver readout signals from the Y electrodes.

In operation, the switching light source 26 is enabled under the condition where the optical fiber array 30 is situated against the particular electrode $X_i$ of the X electrode group, rendering conductive a portion $25_{i-1}$ of the photoconductive layer sandwiched between the electrodes $X_i$ and $Y_1$. At the same time reflective light from an original 22 is incident upon the optical fiber array 30 and light signals indicative of image information are applied to the electrodes $Y_2$ to $Y_n$ facing against the particular electrode $X_i$. To prevent light radiation on the photoconductive layer between the electrodes $Y_1$ and $Y_2$ for rendering conductive that portion of the photoconductive layer, light is shuttered between the electrodes $Y_1$ and $Y_2$ or the portion of the photoconductive layer between the electrodes $Y_1$ and $Y_2$. Under these circumstances where the switching elements $29_2$ and $29_n$ are sequentially turned on with signals from the scanning circuit 31, the portion $25_{i-1}$ of the photoconductive layer beneath the electrode $Y_1$ is supplied with a light signal from the optical fiber array 30. That portion $25_{i-1}$ of the photoconductive layer is electrically coupled with the portion $25_{i-1}$ of the photoconductive layer under conductive due to light from the light source, by way of the electrode $X_i$. An electric circuit from the output terminal OUT is established to output image readout signals, because the power supply 28 is operative. In this embodiment, the X and Y electrodes sandwiching the photoconductive material are optically scanned and the others are electrically scanned.

Whereas the photoconductive layer is CdS in the foregoing embodiments, good readout operation is available with such other materials capable of exhibiting stable photoconductive characteristics over a wide area without difficulties such as amorphous Si, amorphous Se, Se compounds and other organic semiconductor materials. The present invention should not be limited to the contact type sensor but is applicable to conventional image sensors with a scaling-down lens and so forth.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A two-dimensional image readout device comprising:
    a sensor device including an insulating substrate, a plurality of parallel Y electrodes of conductive material, a plurality of X electrodes of conductive material disposed in a direction normal to said Y electrodes with a spacing therebetween, and a photoconductive layer interposed in said spacing between said Y and X electrodes, at least one of said Y and X electrodes being made of transparent material;
    an optical system including a lens for directing to a surface of said sensor device an image portion to be read out, said image portion being selectively directed by said lens onto a region of one X electrode at a time;
    means for moving said optical system and said lens thereof along a path normal to said X electrodes to sequentially align said image portion with each respective X electrodes along said path;
    position detector means for detecting when the lens of said optical system is aligned with a respective one of said X electrodes and for identifying which X electrode is aligned with said lens;
    power supply means for supplying voltage to a selected portion of said photoconductive layer; and
    switch means for selectively connecting said voltage to the X electrode identified by said position detector means to read out an image portion in said photoconductive layer aligned with the identified X electrode.

2. A two-dimensional image readout device according to claim 1 wherein said photoconductive layer is disposed continuously between a plurality of the X and Y electrode pairs.

3. A two-dimensional image readout device according to claim 1 wherein said photoconductive layer is divided and interposed between each opposing pair of said X and Y electrodes.

4. A two-dimensional image readout device according to claim 1 wherein said optical system comprises a one-dimensional optical fiber.

5. A two-dimensional image readout device according to claim 2 wherein the thickness of said photoconductive layer interposed between opposing electrode pairs is less than the spacing between said electrodes.

6. A two-dimensional image readout device according to claim 1 wherein said power supply means supplies a selected one of said electrodes with a voltage positive or negative with respect to the ground and, of said X and Y electrodes other than the electrode for voltage supply, either or both the X electrodes and Y electrodes are grounded, so that current flowing through said photoconductive layer supplied with said voltage is delivered as an output voltage via a load resistor disposed between said photoconductive layer and the ground.

7. A two-dimensional image readout device comprising:

a sensor device including an insulating substrate, a plurality of parallel Y electrodes of conductive material, a plurality of X electrodes of conductive material disposed in a direction normal to said Y electrodes with a spacing therebetween and a photoconductive layer interposed in said spacing between said Y and X electrodes, at least one of said Y and X electrodes being made of transparent material;

a switching light source directed against at least one of said transparent electrodes for selection of said X electrodes;

scanning switches connected to respective ones of said Y electrodes;

a power supply connected between said Y electrodes and at least one of said X electrodes via said switches;

an optical system for directing an image to be read out to the transparent electrodes facing against the opposing electrode selected by said switching light source; and circuit means for electrically scanning said Y electrodes in synchronism with movement between said optical system and said X electrodes wherein siad X and Y electrodes sandwiching said photoconductive material in alignment with said optical system are optically scanned while remaining electrodes are electrically scanned.

8. A two-dimensional image readout device according to claim 7 wherein said switching light source is integral with said optical system for leading the image information to said transparent electrodes.

9. A two-dimensional image readout device according to claim 7 wherein said Y electrodes other than one for voltage supply are grounded via said connected scanning switches.

* * * * *